(12) United States Patent
Choi et al.

(10) Patent No.: US 11,129,274 B2
(45) Date of Patent: Sep. 21, 2021

(54) ROLLABLE DISPLAY DEVICE AND ELECTRONIC DEVICE INCLUDING THE SAME

(71) Applicant: SAMSUNG DISPLAY CO., LTD., Yongin-si (KR)

(72) Inventors: Jin-Hwan Choi, Seoul (KR); Min-Sung Kim, Hwaseong-si (KR); Tae-An Seo, Hwaseong-si (KR); Jung-Hun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/865,169

(22) Filed: May 1, 2020

(65) Prior Publication Data

US 2020/0260569 A1    Aug. 13, 2020

Related U.S. Application Data

(60) Continuation of application No. 16/100,001, filed on Aug. 9, 2018, now Pat. No. 10,721,816, which is a (Continued)

(30) Foreign Application Priority Data

May 10, 2016    (KR) .................... 10-2016-0056988

(51) Int. Cl.
*H05K 1/02* (2006.01)
*H05K 5/00* (2006.01)
(Continued)

(52) U.S. Cl.
CPC .......... *H05K 1/028* (2013.01); *G06F 1/1641* (2013.01); *G06F 1/1652* (2013.01); *G09G 3/20* (2013.01); *H01L 51/52* (2013.01); *H05K 1/181* (2013.01); *G02F 1/133305* (2013.01); *G09G 3/3266* (2013.01); *G09G 3/3275* (2013.01); *G09G 3/3674* (2013.01); *G09G 3/3685* (2013.01);
(Continued)

(58) Field of Classification Search
CPC .......... H05K 1/02; H05K 1/028; H05K 1/181; H05K 5/00; G06F 1/16; G06F 3/041
USPC ........ 361/749, 679.03; 40/515; 345/55, 173; 349/58
See application file for complete search history.

(56) References Cited

U.S. PATENT DOCUMENTS 5,060,632 A    10/1991    Hibino et al.
8,654,519 B2    2/2014    Visser et al.
(Continued)

FOREIGN PATENT DOCUMENTS

CN    101952873 A    1/2011
CN    104553184 A    4/2015
(Continued)

*Primary Examiner* — Xiaoliang Chen
(74) *Attorney, Agent, or Firm* — Lewis Roca Rothgerber Christie LLP

(57) ABSTRACT

A rollable display device includes a rollable structure including a plurality of unit structures, the rollable structure being configured to be rolled and unrolled based on the unit structures, and a display panel structure attached to the rollable structure, wherein respective widths of the unit structures increase in a first direction from a first side of the rollable structure to an opposite second side of the rollable structure.

3 Claims, 10 Drawing Sheets

Related U.S. Application Data division of application No. 15/299,309, filed on Oct. 20, 2016, now Pat. No. 10,051,728.

(51) Int. Cl.

| | | |
|---|---|---|
| *G06F 1/16* | (2006.01) | |
| *G06F 3/041* | (2006.01) | |
| *H05K 1/18* | (2006.01) | |
| *H01L 51/52* | (2006.01) | |
| *G09G 3/20* | (2006.01) | |
| G02F 1/1333 | (2006.01) | |
| G09G 3/36 | (2006.01) | |
| G09G 3/3266 | (2016.01) | |
| G09G 3/3275 | (2016.01) | |
| H01L 51/00 | (2006.01) | |
| H01L 27/32 | (2006.01) | |

(52) U.S. Cl.
CPC ..... *G09G 2310/08* (2013.01); *G09G 2380/02* (2013.01); *H01L 27/3241* (2013.01); *H01L 51/0097* (2013.01); *H01L 2251/5338* (2013.01); *H05K 2201/046* (2013.01); *H05K 2201/051* (2013.01); *H05K 2201/056* (2013.01); *H05K 2201/10128* (2013.01); *H05K 2201/10136* (2013.01); *H05K 2201/10151* (2013.01)

(56) References Cited

U.S. PATENT DOCUMENTS

| | | | |
|---|---|---|---|
| 9,140,540 B2 | 9/2015 | Kuba | |
| 9,209,414 B2 | 12/2015 | Lim et al. | |
| 9,572,267 B2 | 2/2017 | Cho | |
| 9,629,237 B2* | 4/2017 | Cho | G06F 1/1652 |
| 10,147,397 B2 | 12/2018 | Zhang et al. | |
| 10,547,718 B2* | 1/2020 | Lee | H04B 1/3888 |
| 2006/0007368 A1* | 1/2006 | Slikkerveer | G09F 11/29 |
| | | | 349/58 |
| 2006/0107566 A1* | 5/2006 | Van Rens | G09F 9/35 |
| | | | 40/515 |
| 2007/0132387 A1 | 6/2007 | Moore | |
| 2007/0289768 A1 | 12/2007 | Moore et al. | |
| 2008/0086925 A1 | 4/2008 | Yang | |
| 2009/0267870 A1 | 10/2009 | Schellingerhout et al. | |
| 2012/0212433 A1* | 8/2012 | Lee | G06F 3/041 |
| | | | 345/173 |
| 2014/0009419 A1 | 1/2014 | Kim et al. | |
| 2014/0321073 A1 | 10/2014 | Hong et al. | |
| 2015/0220188 A1 | 8/2015 | Zhao | |
| 2015/0234508 A1 | 8/2015 | Cho et al. | |
| 2015/0378391 A1* | 12/2015 | Huitema | G09F 9/301 |
| | | | 361/679.03 |
| 2016/0179236 A1 | 6/2016 | Shin et al. | |
| 2016/0226021 A1* | 8/2016 | Lee | H01L 51/5253 |
| 2016/0231843 A1* | 8/2016 | Kim | G06F 3/0412 |
| 2016/0320804 A1* | 11/2016 | Takayanagi | G06F 1/1679 |
| 2017/0332478 A1* | 11/2017 | Choi | G06F 1/1641 |
| 2017/0332496 A1* | 11/2017 | Choi | G09F 9/301 |
| 2018/0011510 A1* | 1/2018 | Choi | H05K 1/028 |
| 2018/0059727 A1* | 3/2018 | Seo | G06F 1/1656 |

FOREIGN PATENT DOCUMENTS

| | | |
|---|---|---|
| CN | 104659062 A | 5/2015 |
| CN | 104851369 A | 8/2015 |
| KR | 10-1570869 B1 | 11/2015 |
| KR | 10-2015-0137216 A | 12/2015 |
| WO | WO 2010/041227 A1 | 4/2010 |

\* cited by examiner

ROLLABLE DISPLAY DEVICE AND ELECTRONIC DEVICE INCLUDING THE SAME

CROSS-REFERENCE TO RELATED APPLICATIONS

This application is a continuation of U.S. patent application Ser. No. 16/100,001, filed Aug. 9, 2018, now U.S. Pat. No. 10,721,816, which is a divisional of U.S. patent application Ser. No. 15/299,309, filed Oct. 20, 2016, now U.S. Pat. No. 10,051,728, which claims priority to and the benefit of Korean Patent Application No. 10-2016-0056988, filed May 10, 2016, the entire content of both of which is incorporated herein by reference.

BACKGROUND

1. Technical Field

Embodiments of the present inventive concept relate to a rollable display device (e.g., a "rolltop" display device, a bendable display device, a flexible display device, etc.) that can be rolled and unrolled.

2. Description of the Related Art

Recently, consumers attribute greater importance to design of an electronic device when purchasing the electronic device. Further, consumers want an electronic device that can provide a user (e.g., a viewer) with a relatively large image while having portability. Accordingly, a rollable display device is spotlighted as a display device that is included in an electronic device.

Generally, a rollable display device is rolled to achieve a relatively small size when carried, and is unrolled to provide relatively large images to a user when used. To this end, the rollable display device includes a rollable structure, and a display panel structure that is attached to the rollable structure. Here, the display panel structure is rolled when the rollable structure is rolled by the user, while the display panel structure is unrolled when the rollable structure is unrolled by the user.

However, in a conventional rollable display device, stress may be applied to the display panel structure when the rollable structure is rolled and unrolled. Thus, the display panel structure may be damaged, or may be separated from the rollable structure as the display panel structure is pushed out by the stress. Thus, the conventional rollable display device may benefit from a mounting structure for preventing displacement of the display panel structure due to stress occurring when the rollable structure is rolled and unrolled, where the mounting structure is included in the rollable structure.

SUMMARY

Some embodiments provide a rollable display device capable of reducing or preventing a stress from being applied to a display panel structure when a rollable structure attached to the display panel structure is rolled and unrolled by a user without a mounting structure, and thus also provide a rollable display device capable of preventing the display panel structure from being damaged or separated from the rollable structure.

Some embodiments provide an electronic device including the rollable display device (e.g., a flexible electronic device, or rollable electronic device).

According to an aspect of embodiments, a rollable display device may include a rollable structure including a plurality of unit structures, the rollable structure being configured to be rolled and unrolled based on the unit structures, and a display panel structure attached to the rollable structure, wherein respective widths of the unit structures increase or decrease in a first direction from a first side of the rollable structure to an opposite second side of the rollable structure.

The rollable display device may further include a driving integrated circuit configured to drive the display panel structure.

The rollable structure may further include a circuit structure that is adjacent either the first or second side of the rollable structure, and that has the driving integrated circuit located therein.

The circuit structure may be thinner than the unit structures.

Each of the unit structures may include a flat region configured to remain flat when the rollable structure is rolled, and a bendable region configured to change from flat to curved when the rollable structure is rolled.

The unit structures may collectively form first through (n)th rolling cycles when the rollable structure is rolled, n being an integer that is greater than or equal to 2, and a (k)th rolling cycle may encircle a (k−1)th rolling cycle, k being an integer between 2 and n.

An average width of the flat regions of the (k)th rolling cycle and an average radius of curvature of the bendable regions of the (k)th rolling cycle may be respectively greater than an average width of the flat regions of the (k−1)th rolling cycle and an average radius of curvature of the bendable regions of the (k−1)th rolling cycle.

An angle between adjacent ones of the unit structures may be greater than or equal to 145 degrees, or some other suitable angle, in each of the first through (n)th rolling cycles.

Widths of the flat regions may be different from each other in each of the first through (n)th rolling cycles, and radiuses of curvature of the bendable regions may be equal to each other in each of the first through (n)th rolling cycles.

The widths of the flat regions may increase in the first direction in each of the first through (n)th rolling cycles.

Widths of the flat regions may be equal to each other in each of the first through (n)th rolling cycles, and radiuses of curvature of the bendable regions may be different from each other in each of the first through (n)th rolling cycles.

The radiuses of curvature of the bendable regions may increase in the first direction in each of the first through (n)th rolling cycles.

Widths of the flat regions may be different from each other in each of the first through (n)th rolling cycles, and radiuses of curvature of the bendable regions may be different from each other in each of the first through (n)th rolling cycles.

The widths of the flat regions and the radiuses of curvature of the bendable regions may increase in the first direction in each of the first through (n)th rolling cycles.

According to an aspect of embodiments, an electronic device may include a rollable display device including a rollable structure that includes a plurality of unit structures, and that is configured to be rolled and unrolled based on the unit structures, and a display panel structure attached to the rollable structure, a rolling detection sensor configured to generate a rolling detection signal for indicating whether the rollable display device is rolled or unrolled, and a processor configured to control a displaying operation of the rollable display device based on the rolling detection signal, wherein respective widths of the unit structures increase or decrease in a first direction from a first side of the rollable structure to an opposite second side of the rollable structure.

Each of the unit structures may include a flat region configured to remain flat when the rollable structure is rolled, and a bendable region configured to change from flat to curved when the rollable structure is rolled.

The unit structures may collectively form first through (n)th rolling cycles when the rollable structure is rolled, n being an integer that is greater than or equal to 2, wherein a (k)th rolling cycle encircles a (k−1)th rolling cycle, k being an integer between 2 and n, and an average width of the flat regions of the (k)th rolling cycle and an average radius of curvature of the bendable regions of the (k)th rolling cycle may be respectively greater than an average width of the flat regions of the (k−1)th rolling cycle and an average radius of curvature of the bendable regions of the (k−1)th rolling cycle.

Radiuses of curvature of the bendable regions may be equal to each other in each of the first through (n)th rolling cycles, and widths of the flat regions may increase in the first direction in each of the first through (n)th rolling cycles.

Widths of the flat regions may be equal to each other in each of the first through (n)th rolling cycles, and radiuses of curvature of the bendable regions may increase in the first direction in each of the first through (n)th rolling cycles.

Widths of the flat regions and radiuses of curvature of the bendable regions may increase in the first direction in each of the first through (n)th rolling cycles.

According to an aspect of embodiments, a rollable display device may include a rollable structure including a plurality of unit structures, a shape of the rollable structure, when rolled, corresponding to shapes of the unit structures, and a display panel structure attached to the rollable structure, wherein, of two of the unit structures, a width of one of the two that is closer to a first side of the rollable structure is less than a width of the other of the two that is closer to a second side of the rollable structure, the second side being opposite to the first side.

Each of the unit structures may include a first region configured to remain flat when the rollable structure is rolled, and a second region configured to change from flat to curved when the rollable structure is rolled, wherein the unit structures collectively form a plurality of rolling cycles when the rollable structure is rolled, and wherein a (k)th rolling cycle encircles a (k−1)th rolling cycle, k being an integer that is greater than or equal to 2.

The first regions of two of the unit structures corresponding to a same one of the rolling cycles may have a same width, the respective first regions of two of the unit structures respectively corresponding to one of two different ones of the rolling cycles may have different widths, and the second regions of all of the unit structures may have a same radius of curvature.

The second regions of two of the unit structures corresponding to a same one of the rolling cycles may have a same radius of curvature, the respective second regions of two of the unit structures respectively corresponding to one of two different ones of the rolling cycles may have different radiuses of curvature, and the first regions of all of the unit structures may have a same width.

The first regions of two of the unit structures corresponding to a same one of the rolling cycles may have a same width, the respective first regions of two of the unit structures respectively corresponding to one of two different ones of the rolling cycles may have different widths, the second regions of two of the unit structures corresponding to a same one of the rolling cycles may have a same radius of curvature, and the respective second regions of two of the unit structures respectively corresponding to one of two different ones of the rolling cycles may have different radiuses of curvature.

Therefore, a rollable display device according to embodiments may include a display panel structure and a rollable structure, and may increase widths of unit structures included in the rollable structure in a direction from a first side of the rollable structure to a second side of the rollable structure that is opposite to the first side of the rollable structure, where each of the unit structures includes a flat region of which a shape is maintained to be flat when the rollable structure is rolled, and a bendable region of which a shape is able to be changed from a flat shape to a curved shape when the rollable structure is rolled. Thus, the rollable display device may prevent a stress from being applied to the display panel structure when the rollable structure is rolled and unrolled by a user without a mounting structure, and thus may prevent the display panel structure from being damaged or separated from the rollable structure.

In addition, an electronic device including the rollable display device according to embodiments may achieve durability by reducing or preventing deterioration (or, degradation) of the rollable display device while achieving portability, usability, and good design.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Hereinafter, embodiments of the present inventive concept will be explained in detail with reference to the accompanying drawings.

Figure 1:
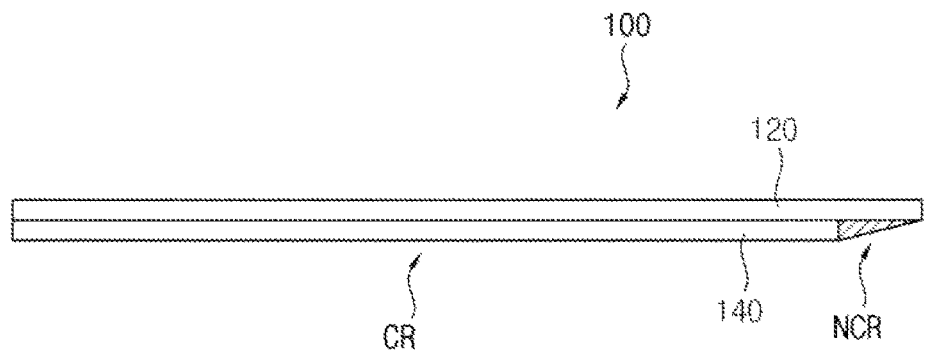
FIG. 1 is a diagram illustrating a rollable display device according to embodiments.
Figure 2:
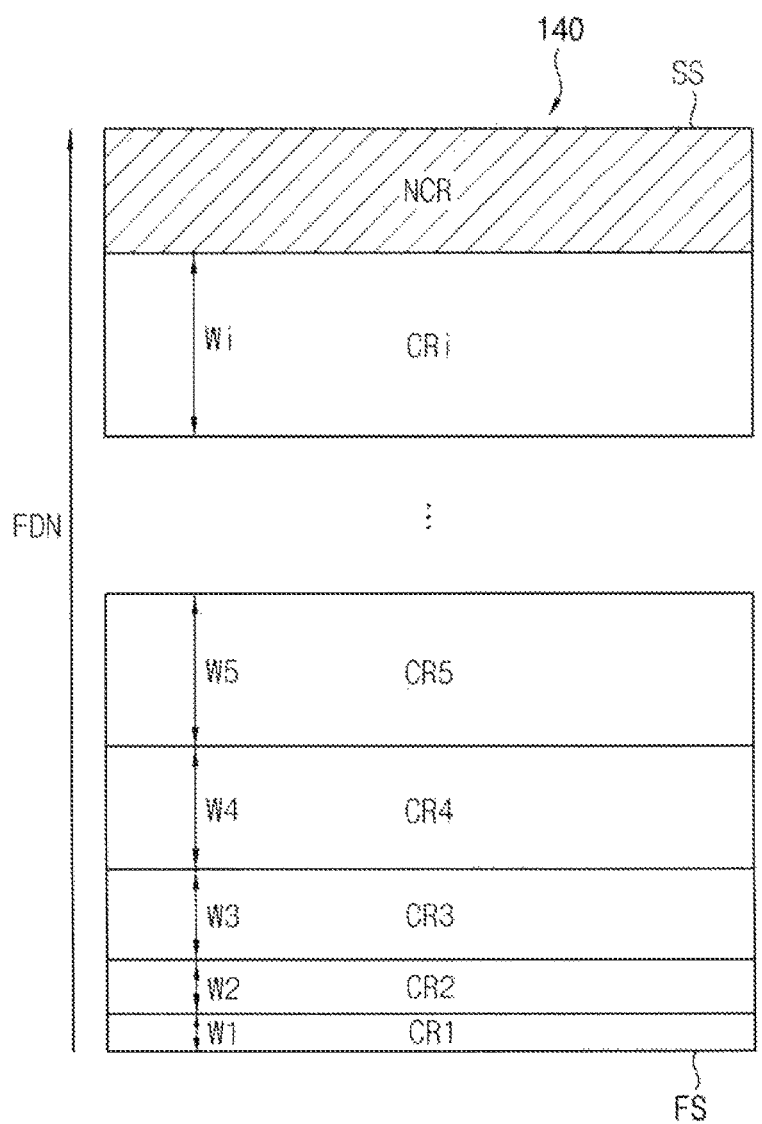
FIG. 2 is a plan view illustrating a rollable structure included in the rollable display device of FIG. 1.
Figure 3:
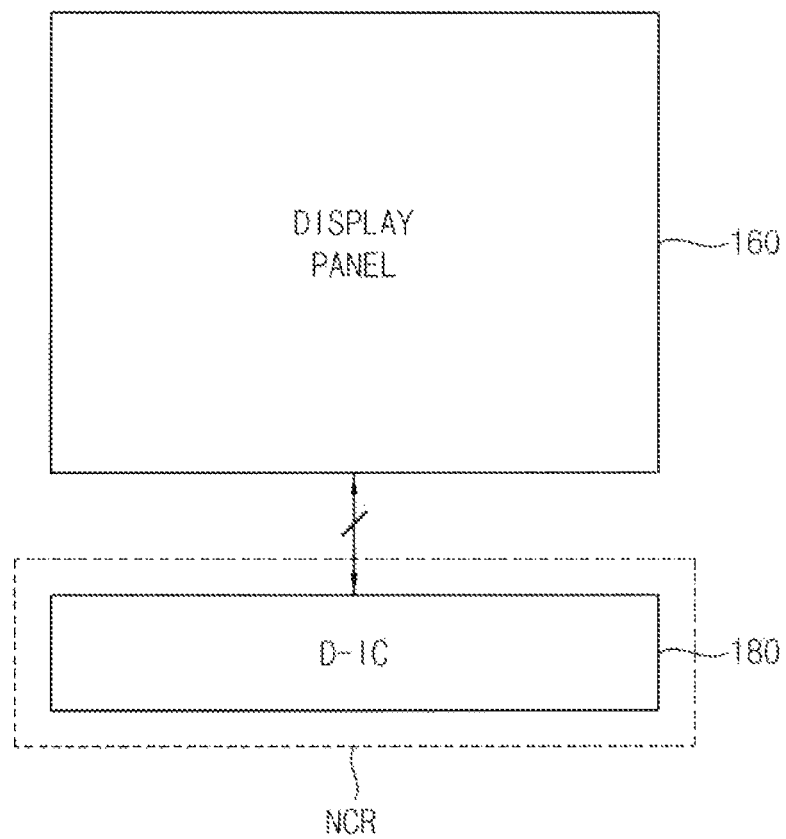
FIG. 3 is a block diagram for describing a displaying operation of the rollable display device of FIG. 1.

FIG. 1 is a diagram illustrating a rollable display device according to embodiments. FIG. 2 is a plan view illustrating a rollable structure included in the rollable display device of FIG. 1. FIG. 3 is a block diagram for describing a displaying operation of the rollable display device of FIG. 1.

Referring to FIGS. 1 through 3, the rollable display device 100 may include a display panel structure (e.g., a display panel) 120 and a rollable structure 140. In an embodiment, the rollable display device 100 may further include a driving integrated circuit ("D-IC") 180 that drives the display panel structure 120. In this case, as illustrated in FIG. 3, the display panel structure 120 and the rollable structure 140 may constitute a display panel 160. Further, the rollable structure 140 may further include a circuit structure NCR that is adjacent either a first side FS or a second side SS of the rollable structure 140. Also, the driving integrated circuit 180 may be located in the circuit structure NCR of the rollable structure 140. In FIG. 2, it is illustrated that the circuit structure NCR is adjacent the second side SS of the rollable structure 140. In some embodiments, the driving integrated circuit 180 may be located outside the rollable display device 100, and thus, the rollable structure 140 may omit the circuit structure NCR.

The display panel structure 120 may be attached to the rollable structure 140. Here, because the display panel structure 120 is manufactured with flexible materials, the display panel structure 120 may be rolled and unrolled as the rollable structure 140 is rolled and unrolled. The display panel structure 120 may include a plurality of pixels. In an embodiment, the pixels may include red color emission pixels, green color emission pixels, and blue color emission pixels. In another embodiment, the pixels may include red color emission pixels, green color emission pixels, blue color emission pixels, and white color emission pixels. Thus, the display panel structure 120 may display an image using the pixels. In an embodiment, the rollable display device 100 may be an organic light emitting display (OLED) device. In this case, the display panel structure 120 may include an organic light emitting structure including organic light emitting diodes.

In another embodiment, the rollable display device 100 may be a liquid crystal display (LCD) device. In this case, the display panel structure 120 may include a liquid crystal structure including liquid crystals. However, the rollable display device 100 is not limited thereto. The rollable structure 140 may include a plurality of unit structures CR1 through CRi, and thus the rollable structure 140 may be rolled and unrolled in a manner corresponding to the unit structures CR1 through CRi (e.g., the shape, structure, and configuration of the rollable structure 140, when rolled, may be determined by the shapes, sizes, and configurations of the unit structures CR1 through CRi). Here, widths W1 through Wi of the unit structures CR1 through CRi may incrementally increase in a direction from the first side FS of the rollable structure 140 to the second side SS of the rollable structure 140, the second side SS being opposite to the first side FS of the rollable structure 140. For example, the width W2 of the second unit structure CR2 may be greater than the width W1 of the first unit structure CR1, the first unit structure CR1 being the closest to the first side FS of the rollable structure 140. Further, the width W3 of the third unit structure CR3 may be greater than the width W2 of the second unit structure CR2, and the width W4 of the fourth unit structure CR4 may be greater than the width W3 of the third unit structure CR3. Thus, the display panel structure 120 may be neither damaged nor separated from the rollable structure 140 when the rollable structure 140 is rolled in a first direction FDN.

Specifically, each of the unit structures CR1 through CRi may include a flat region (e.g., a first region) to be maintained flat when the rollable structure 140 is rolled, and a bendable region (e.g., a second region) of which a shape is changed from flat to curved when the rollable structure 140 is rolled. As the rollable structure 140 is rolled, the unit structures CR1 through CRi may collectively constitute first through (n)th rolling cycles, where n is an integer that is greater than or equal to 2. Here, the (k)th rolling cycle may encircle the (k−1)th rolling cycle, where k is an integer between 2 and n.

For example, because the unit structures CR1 through CRi sequentially constitute the first through (n)th rolling cycles as the rollable structure 140 is rolled in the first direction FDN, the second rolling cycle may encircle the first rolling cycle, the third rolling cycle may encircle the second rolling cycle, and the fourth rolling cycle may encircle the third rolling cycle. Here, the bendable region(s) may determine, or correspond to, a radius of curvature in each of the first through (n)th rolling cycles. For example, the radius of curvature may be relatively great when a width of the bendable region is relatively great. In addition, the radius of curvature may be relatively small when the width of the bendable region is relatively small. Thus, circles that are respectively formed by corresponding ones of the bendable regions of the unit structures CR1 through CRi may increase in size as the radius of curvature increases in the first direction FDN. Thus, because the widths W1 through Wi of the respective unit structures CR1 through CRi increase in the direction from the first side FS to the second side SS of the rollable structure 140 (i.e., in the first direction FDN), an average width of the flat regions of the (k)th rolling cycle and an average radius of curvature of the bendable regions of the (k)th rolling cycle may be respectively greater than an average width of the flat regions of the (k−1)th rolling cycle and an average radius of curvature of the bendable regions of the (k−1)th rolling cycle.

In some embodiments, in each of the first through (n)th rolling cycles, an angle between adjacent ones of the unit structures CR1 through CRi (e.g., between an extension line extending from a flat region of a unit structure and an extension line extending from a flat region of an adjacent one of the unit structures, the adjacent flat regions being of two adjacent ones of the unit structures CR1 through CRi) may be maintained to be greater than or equal to a reference angle (e.g., 145 degrees or any suitable angle known to those skilled in the art). In this case, because adjacent ones of the unit structures CR1 through CRi are not folded at less than the reference angle, a stress applied to the display panel structure 120, and deterioration due to the stress, may be reduced or prevented.

In an embodiment, in each of the first through (n)th rolling cycles, the widths of the flat regions of the unit structures CR1 through CRi may be different from each other, and the radiuses of curvature of the bendable regions of the unit structures CR1 through CRi may be equal to each other. Here, because the widths W1 through Wi of the unit structures CR1 through CRi increase in the first direction FDN of FIG. 2, in each of the first through (n)th rolling cycles, the widths of the flat regions of the unit structures CR1 through CRi may also increase in the first direction FDN of FIG. 2.

In another embodiment, in each of the first through (n)th rolling cycles, the widths of the flat regions of the unit structures CR1 through CRi may be equal to each other, and the radiuses of curvature of the bendable regions of the unit structures CR1 through CRi may be different from each other. Here, because the widths W1 through Wi of the unit structures CR1 through CRi increase in the first direction FDN of FIG. 2, in each of the first through (n)th rolling cycles, the radiuses of curvature of the bendable regions of the unit structures CR1 through CRi may also increase in the first direction FDN of FIG. 2.

In still another embodiment, in each of the first through (n)th rolling cycles, the widths of the flat regions of the unit structures CR1 through CRi may be different from each other, and the radiuses of curvature of the bendable regions of the unit structures CR1 through CRi may also be different from each other. Here, because the widths W1 through Wi of the unit structures CR1 through CRi increase in the first direction FDN of FIG. 2, in each of the first through (n)th rolling cycles, the widths of the flat regions of the unit structures CR1 through CRi, along with the radiuses of curvature of the bendable regions of the unit structures CR1 through CRi, may increase in the first direction FDN of FIG. 2. The above embodiments will be described in detail with reference to FIGS. 4 through 10B.

As described above, the rollable structure 140 may further include the circuit structure NCR that is adjacent either the first side FS or the second side SS of the rollable structure 140. In this case, a chip-on flexible (COF) printed circuit board, a flexible printed circuit board (FPCB), a power connector, etc. as well as the driving integrated circuit 180 may be included in the circuit structure NCR of the rollable structure 140. In an embodiment, as illustrated in FIG. 1, a thickness of the circuit structure NCR of the rollable structure 140 may be thinner than that of the unit structures CR1 through CRi of the rollable structure 140.

As illustrated in FIG. 3, the driving integrated circuit 180 may drive the display panel 160. For this operation, the driving integrated circuit 180 may include a scan driver, a data driver, a timing controller, etc. The display panel 160 may be connected to the driving integrated circuit 180 via a plurality of scan-lines and a plurality of data-lines. The scan driver may provide a scan signal to the display panel 160 via the scan-lines. The data driver may provide a data signal to the display panel 160 via the data-lines. The timing controller may control the scan driver, the data driver, etc. However, components included in the driving integrated circuit 180 are not limited thereto. For example, the driving integrated circuit 180 may further include a power supply that supplies power to the display panel 160.

In brief, the rollable display device 100 may include the display panel structure 120 and the rollable structure 140, and the respective widths W1 through Wi of the unit structures CR1 through CRi included in the rollable structure 140 may increase in the first direction FDN of FIG. 2, where each of the unit structures CR1 through CRi includes the flat region to be maintained flat when the rollable structure 140 is rolled, and includes the bendable region to be changed from flat to curved when the rollable structure 140 is rolled. Thus, the rollable display device 100 may prevent a stress from being applied to the display panel structure 120 when the rollable structure 140 is rolled and unrolled by a user without a mounting structure, and thus may prevent the display panel structure 120 from being damaged or separated from the rollable structure 140.

That is, in the rollable display device 100, because the flat region is positioned between the bendable regions in each of the unit structures CR1 through CRi, the display panel structure 120 may be prevented from being pushed out at the bendable regions of the rollable structure 140. In addition, in the rollable display device 100, because the widths W1 through Wi of the unit structures CR1 through CRi increase in the first direction FDN of FIG. 2, a stress that is accumulated from an inner rolling cycle to an outer rolling cycle may be alleviated. As a result, a serious stress otherwise applied to the display panel structure 120 may be reduced or avoided.

Further, in the rollable display device 100, because the widths of the flat regions of the unit structures CR1 through CRi and/or the radiuses of curvature of the bendable regions of the unit structures CR1 through CRi increase in the first direction FDN of FIG. 2, mutual interference (e.g., bump, collision) between corresponding unit structures of adjacent rolling cycles may be prevented, and thus, deterioration of the display panel structure 120 may be prevented or reduced.

In other embodiments, widths of two or more adjacent unit structures may be the same, although a width of a unit structure that is closest to the second side SS of the rollable structure 140 is larger than a width of a unit structure that is closest to the first side FS of the rollable structure 140.

Figure 4:
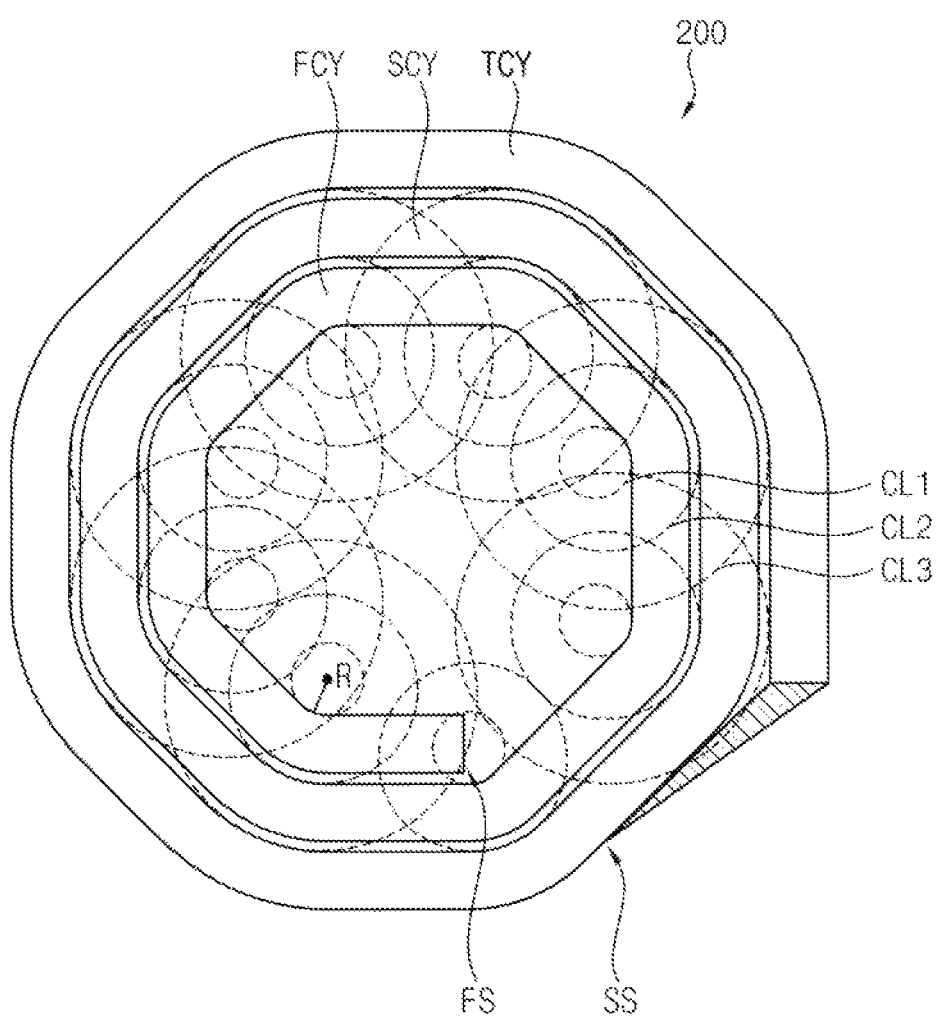
FIGS. 4, 5A, and 5B are lateral views illustrating an example of a rollable structure included in the rollable display device of FIG. 1.
Figure 5A:
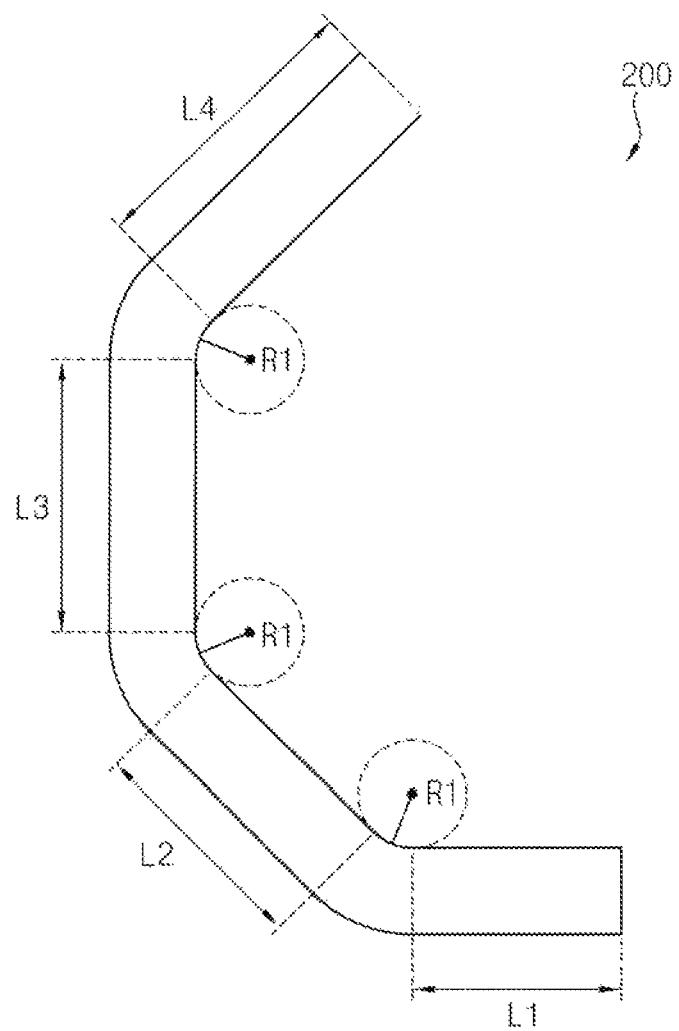
Figure 5B:
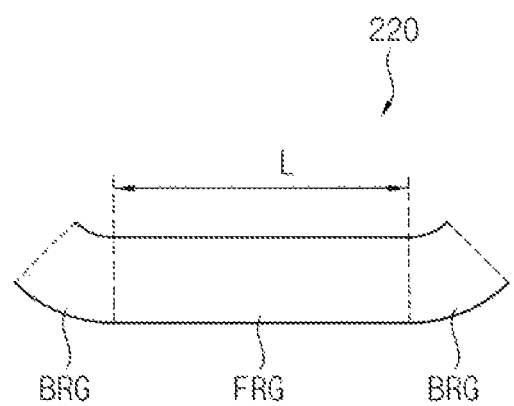
Figure 6A:
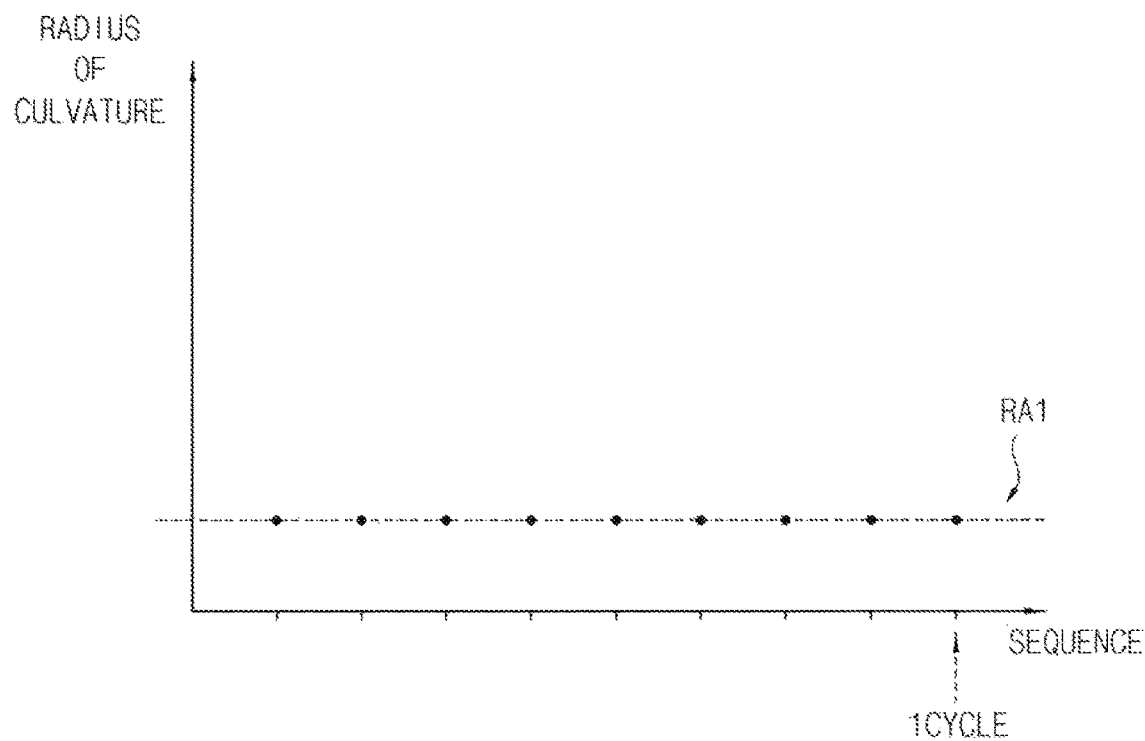
FIGS. 6A and 6B are diagrams for describing one cycle of the rollable structure of FIG. 4.
Figure 6B:
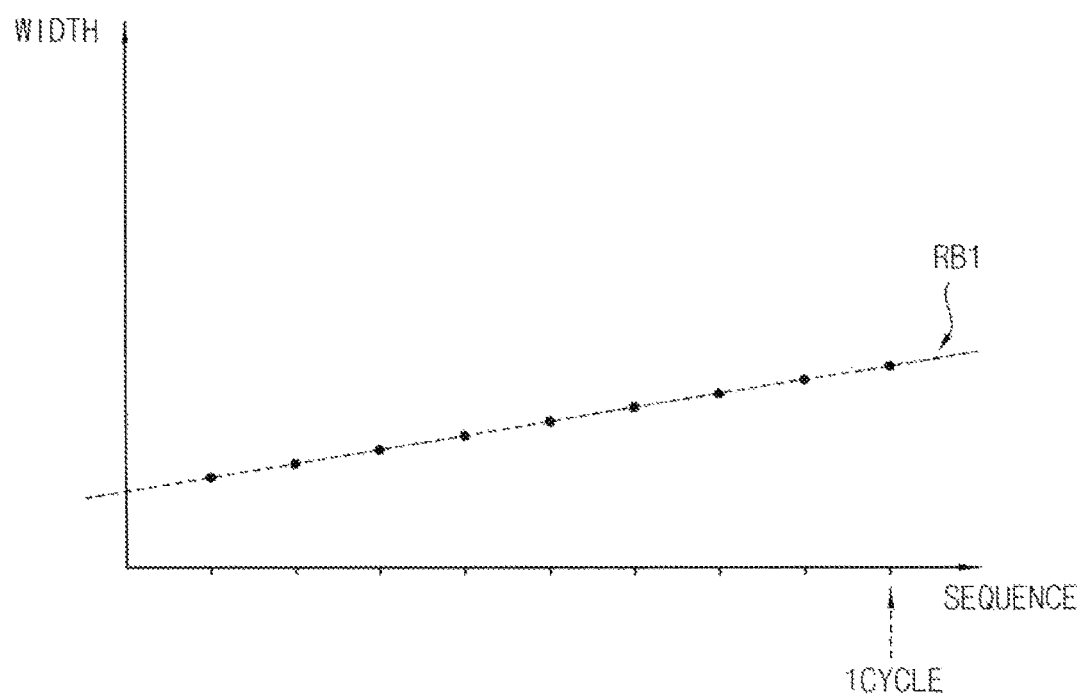

FIGS. 4 through 5B are lateral views illustrating an example of a rollable structure included in the rollable display device of FIG. 1. FIGS. 6A and 6B are diagrams for describing one cycle of the rollable structure of FIG. 4.

Referring to FIGS. 4, 5A, 5B, 6A, and 6B, the rollable display device 200 may include a display panel structure and a rollable structure to which the display panel structure is attached. For convenience of description, only the rollable structure is shown in FIGS. 4, 5A, and 5B.

As illustrated in FIGS. 4, 5A, and 5B, the rollable structure may include a plurality of unit structures 220 (see FIG. 5B). The rollable structure may be rolled and unrolled based on the unit structures 220 (e.g., a shape or configuration of the rollable structure, when rolled, may correspond to the shape and size of the unit structures 220). Here, as shown in FIG. 5B, each of the unit structures 220 may include a flat region FRG that maintains a flat shape when the rollable structure is rolled, and may also include a bendable region BRG, which changes from a flat shape to a curved shape when the rollable structure is rolled. As described above, widths of the unit structures 220 may increase in a direction from a first side FS to a second side SS of the rollable structure, where the second side SS is opposite to the first side FS. For example, the width of the unit structure 220 that is closest to the first side FS of the rollable structure is the smallest among the widths of the unit structures 220 included in the rollable structure, while the width of the unit structure 220 that is closest to the second side SS of the rollable structure is the greatest among the widths of the unit structures 220 included in the rollable structure.

As illustrated in FIG. 4, the unit structures 220 may constitute first, second, and third rolling cycles FCY, SCY, and TCY as the rollable structure is rolled. Here, the second rolling cycle SCY may encircle the first rolling cycle FCY, and the third rolling cycle TCY may encircle the second rolling cycle SCY. In each of the first through third rolling cycles FCY, SCY, and TCY, the bendable regions BRG may determine a corresponding radius of curvature R. Here, as the radius of curvature R increases, circles CL1, CL2, and CL3 formed by the bendable regions BRG of the unit structures 220 increase, and thus, widths of the bendable regions BRG of the unit structures 220 increase. Thus, because the widths of the unit structures 220 increase in the first direction FDN in FIG. 2, an average width of the flat regions FRG of the second rolling cycle SCY and an average radius of curvature of the bendable regions BRG of the second rolling cycle SCY, may respectively be greater than an average width of the flat regions FRG of the first rolling cycle FCY and an average radius of curvature of the bendable regions BRG of the first rolling cycle FCY. Similarly, an average width of the flat regions FRG of the third rolling cycle TCY and an average radius of curvature of the bendable regions BRG of the third rolling cycle TCY may respectively be greater than the average width of the flat regions FRG of the second rolling cycle SCY and the average radius of curvature of the bendable regions BRG of the second rolling cycle SCY. In some embodiments, in each of the first through third rolling cycles FCY, SCY, and TCY, an angle between adjacent ones of the unit structures 220 may be maintained to be greater than or equal to a reference angle (e.g., 145 degrees). Thus, a stress applied to the display panel structure attached to the rollable structure, and deterioration due to the stress, may be reduced or prevented.

In other embodiments, although the widths of the flat regions FRG generally increase in the first direction FDN (see FIG. 2), the flat regions FRG of two or more adjacent unit structures 220 may have substantially equal widths (e.g., two or more flat regions FRG of unit structures 220 corresponding to a same one of the first through third rolling cycles FCY, SCY, and TCY may have equal widths), while flat regions FRG of unit structures 220 corresponding to a particular rolling cycle may have widths that are less than the widths of flat regions FRG of unit structures 220 of a subsequent rolling cycle (e.g., flat regions FRG of unit structures 220 corresponding to the second rolling cycle SCY may have widths that are greater than the widths of the flat regions FRG of unit structures 220 corresponding to the first rolling cycle FCY, but that are less than the widths of the flat regions FRG of unit structures 220 corresponding to the third rolling cycle TCY).

As illustrated in FIGS. 6A and 6B, in one rolling cycle (indicated by 1CYCLE), widths L of the flat regions FRG of the unit structures 220 may be different from each other (e.g., see RB1 in FIG. 6B), and radiuses of curvature R of the bendable regions BRG of the unit structures 220 may be equal to each other (e.g., see RA1 in FIG. 6A). Because the widths of the unit structures 220 increase in the first direction FDN in FIG. 2, in each of the first through third rolling cycles FCY, SCY, and TCY, the widths L of the flat regions FRG of the unit structures 220 may increase in the first direction FDN in FIG. 2 (e.g., see L1, L2, L3, and L4 in FIG. 5A). That is, the widths L of the flat regions FRG of the unit structures 220 may increase according to rolling sequences of the unit structures 220 included in the rollable structure.

On the other hand, in each of the first through third rolling cycles FCY, SCY, and TCY, the radiuses of curvature R of the bendable regions BRG of the unit structures 220 may be equal to each other (e.g., see R1 in FIG. 5A), regardless of the rolling sequences of the unit structures 220 included in the rollable structure. In each of the first through third rolling cycles FCY, SCY, and TCY, because the widths L of the flat regions FRG of the unit structures 220 increase in the first direction FDN in FIG. 2, although the radiuses of curvature R of the bendable regions BRG of the unit structures 220 are equal to each other, the widths of the unit structures 220 may increase in the first direction FDN in FIG. 2.

As described above, the circles CL1, CL2, and CL3 formed by respective ones of the bendable regions BRG of the unit structures 220 increase from the first rolling cycle FCY to the third rolling cycle TCY. Thus, the radiuses of curvature R of the bendable regions BRG of the unit structures 220 may change (e.g., increase) at cycle transition points of the first through third rolling cycles FCY, SCY, and TCY. As a result, the widths of the bendable regions BRG of the unit structures 220 may change (e.g., increase) at the cycle transition points of the first through third rolling cycles FCY, SCY, and TCY.

In brief, the rollable display device 200 may include the display panel structure and the rollable structure, and may increase the widths of the unit structures 220 included in the rollable structure in the first direction FDN in FIG. 2, where each of the unit structures 220 includes the flat region FRG that is to remain flat when the rollable structure is rolled, and the bendable region BRG that is to change from flat to curved when the rollable structure is rolled. Thus, the rollable display device 200 may reduce or prevent a stress otherwise applied to the display panel structure when the rollable structure is rolled and unrolled by a user without a mounting structure, and thus may reduce or prevent damage to the display panel structure, or separation of the display panel structure from the rollable structure.

Figure 7A:
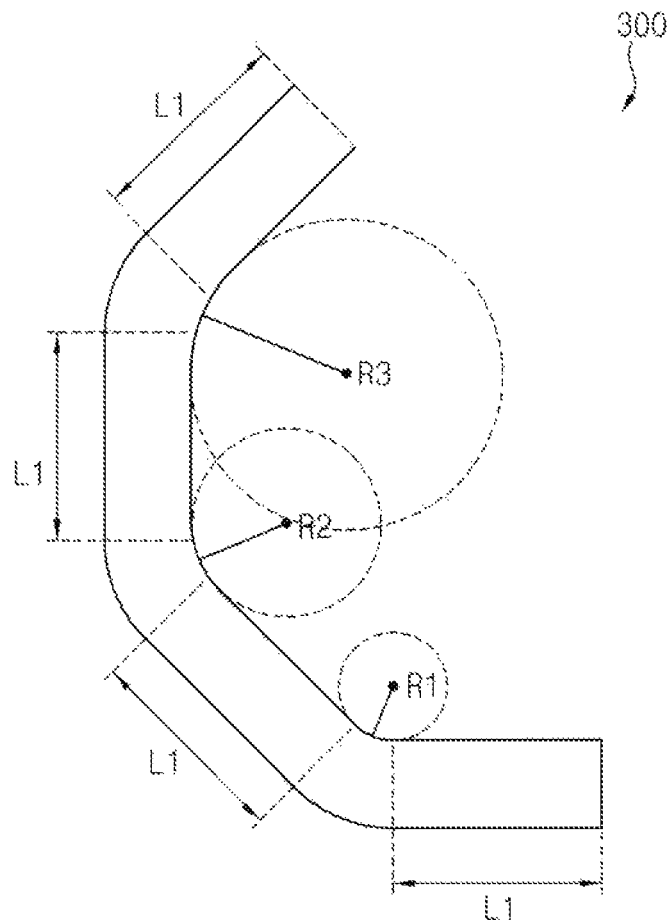
FIGS. 7A and 7B are lateral views illustrating another example of a rollable structure included in the rollable display device of FIG. 1.
Figure 7B:
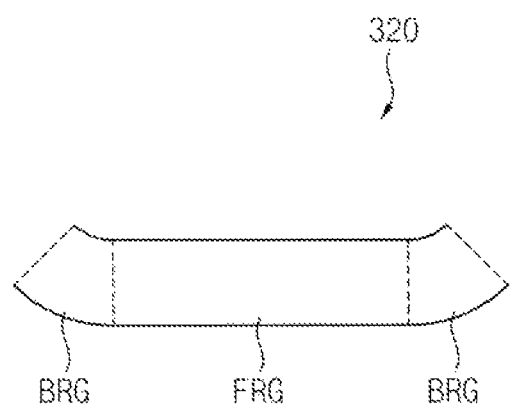
Figure 8A:
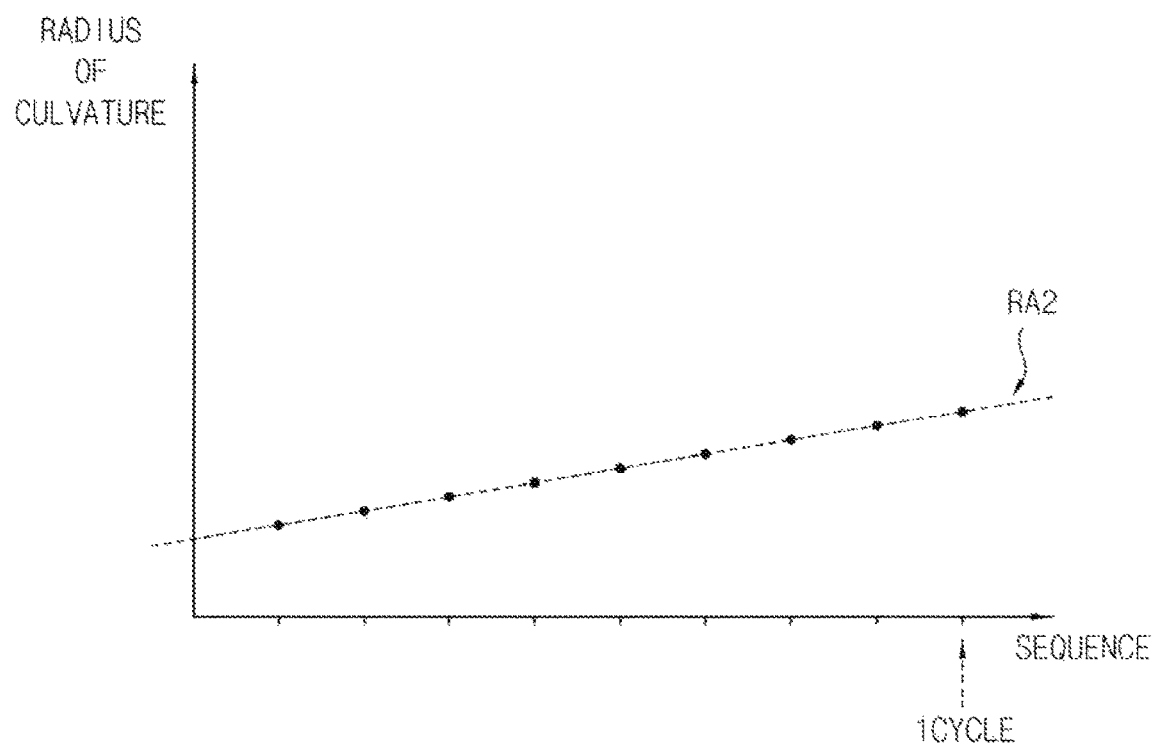
FIGS. 8A and 8B are diagrams for describing one cycle of the rollable structure of FIG. 7A.
Figure 8B:
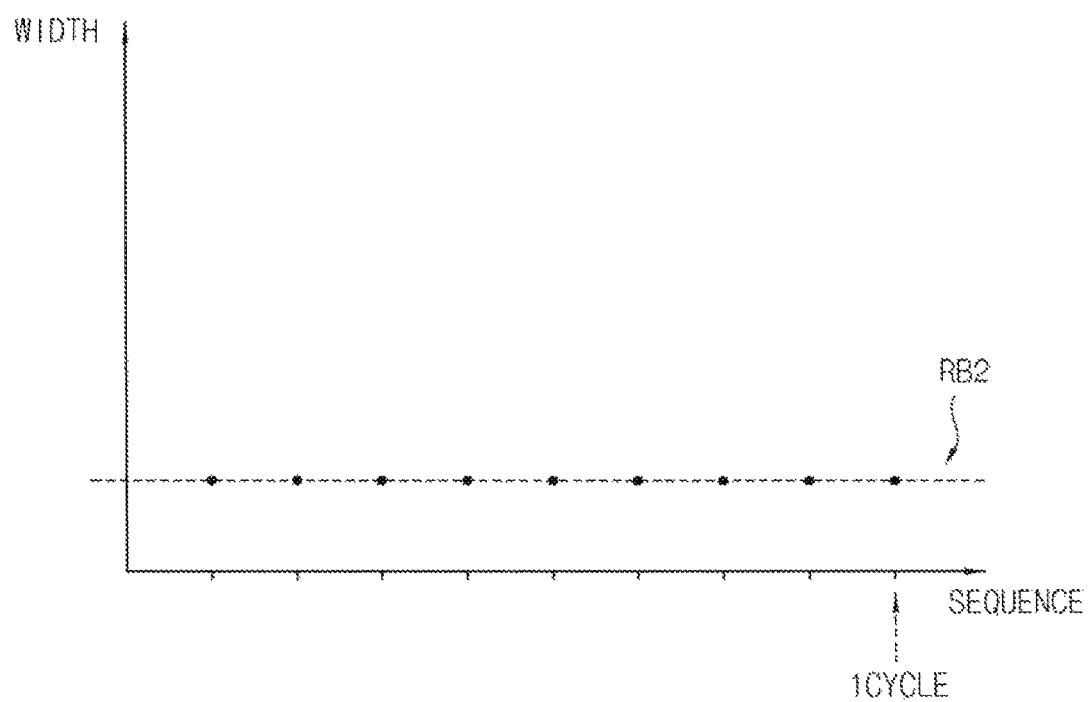

FIGS. 7A and 7B are lateral views illustrating another example of a rollable structure included in the rollable display device of FIG. 1. FIGS. 8A and 8B are diagrams for describing one cycle of the rollable structure of FIG. 7A.

Referring to FIGS. 7A, 7B, 8A, and 8B, the rollable structure may include a plurality of unit structures 320, as shown in FIG. 7B. The rollable structure may be rolled and unrolled based on the unit structures 320. Here, each of the unit structures 320 may include a flat region FRG, of which a shape is maintained as flat when the rollable structure is rolled, and may also include a bendable region BRG, of which a shape is changed from a flat shape to a curved shape when the rollable structure is rolled.

As described above, widths of the unit structures 320 may increase in a direction from a first side of the rollable structure to an opposite second side of the rollable structure (e.g., in the first direction FDN shown in FIG. 2). For example, the width of the unit structure 320 that is most adjacent the first side of the rollable structure may be the smallest among the widths of the unit structures 320 included in the rollable structure, and the width of the unit structure 320 that is most adjacent the second side of the rollable structure is the greatest among the widths of the unit structures 320 included in the rollable structure.

The unit structures 320 may constitute first through third rolling cycles as the rollable structure is rolled. Here, the second rolling cycle may encircle the first rolling cycle, and the third rolling cycle may encircle the second rolling cycle. In each of the first through third rolling cycles, the bendable regions BRG may determine a corresponding radius of curvature. Here, as the radius of curvature increases, circles formed by corresponding ones of the bendable regions BRG of the unit structures 320 may increase, and thus, widths of the bendable regions BRG of the unit structures 320 may increase. Thus, because the widths of the unit structures 320 increase in the first direction FDN of FIG. 2, an average width of the flat regions FRG of the second rolling cycle and an average radius of curvature of the bendable regions BRG of the second rolling cycle may respectively be greater than an average width of the flat regions FRG of the first rolling cycle and an average radius of curvature of the bendable regions BRG of the first rolling cycle. Also, an average width of the flat regions FRG of the third rolling cycle and an average radius of curvature of the bendable regions BRG of the third rolling cycle may respectively be greater than the average width of the flat regions FRG of the second rolling cycle and the average radius of curvature of the bendable regions BRG of the second rolling cycle. In some embodiments, in each of the first through third rolling cycles, an angle between adjacent ones of the unit structures 320 may be maintained to be greater than or equal to a reference angle (e.g., 145 degrees). Thus, a stress otherwise applied to the display panel structure attached to the rollable structure, and deterioration due to the stress, may be reduced or prevented.

In other embodiments, although the radiuses of curvature of the bendable regions BRG generally increase in the first direction FDN (see FIG. 2), the bendable regions BRG of two or more adjacent unit structures 320 may have substantially equal radiuses of curvature (e.g., two or more bendable regions BRG of unit structures 320 corresponding to a same one of the first through third rolling cycles FCY, SCY, and TCY may have equal radiuses of curvature), while bendable regions BRG of unit structures 320 corresponding to a particular rolling cycle may have radiuses of curvature that are less than the radiuses of curvature of bendable regions BRG of unit structures 320 of a subsequent rolling cycle (e.g., bendable regions BRG of unit structures 320 corresponding to the second rolling cycle SCY may have radiuses of curvature that are greater than the radiuses of curvature of the bendable regions BRG of unit structures 320 corresponding to the first rolling cycle FCY, but that are less than the radiuses of curvature of the bendable regions BRG of unit structures 320 corresponding to the third rolling cycle TCY).

As illustrated in FIGS. 8A and 8B, in one rolling cycle (indicated by 1CYCLE), widths of the flat regions FRG of the unit structures 320 may be equal to each other (indicated by RB2 in FIG. 8B), and radiuses of curvature of the bendable regions BRG of the unit structures 320 may be different from each other (indicated by RA2 in FIG. 8A). Because the widths of the unit structures 320 increase in the first direction FDN (see FIG. 2), in each of the first through third rolling cycles, the radiuses of curvature of the bendable regions BRG of the unit structures 320 may increase in the first direction FDN (as indicated by radiuses of curvature R1, R2, and R3 in FIG. 7A). That is, the radiuses of curvature of the bendable regions BRG of the unit structures 320 may increase according to rolling sequences of the unit structures 320 included in the rollable structure.

On the other hand, in each of the first through third rolling cycles, the widths of the flat regions FRG of the unit structures 320 may be equal to each other (as indicated by width L1 in FIG. 7A), regardless of the rolling sequences of the unit structures 320 included in the rollable structure. In each of the first through third rolling cycles, because the radiuses of curvature of the bendable regions BRG of the unit structures 320 increase in the first direction FDN, although the widths of the flat regions FRG of the unit structures 320 are equal to each other, the widths of the unit structures 320 may increase in the first direction FDN.

As described above, the widths of the flat regions FRG of the unit structures 320 increase from the first rolling cycle to the second rolling cycle, and from the second rolling cycle to the third rolling cycle. Thus, the widths of the flat regions FRG of the unit structures 320 may change (e.g., increase) at cycle transition points of, or between, respective ones of the first, second, and third rolling cycles. In brief, the rollable display device 300 may include the display panel structure and the rollable structure, and the widths of the unit structures 320 included in the rollable structure may increase in the first direction FDN, where each of the unit structures 320 includes the flat region FRG, which maintains a flat shape when the rollable structure is rolled, and also includes the bendable region BRG, which changes from the flat shape to the curved shape when the rollable structure is rolled. Thus, the rollable display device 300 may reduce or prevent a stress that would otherwise be applied to the display panel structure when the rollable structure is rolled and unrolled by a user, and may do so without use of a mounting structure, and thus, may prevent the display panel structure from being damaged or from being separated from the rollable structure.

Figure 9A:
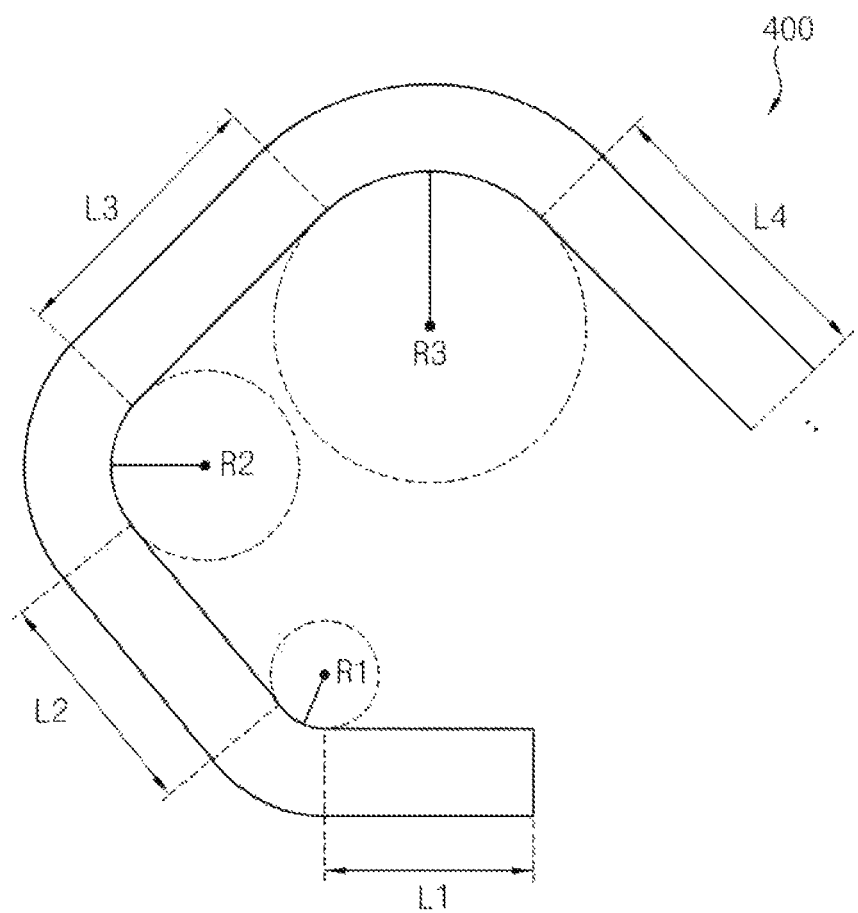
FIGS. 9A and 9B are lateral views illustrating still another example of a rollable structure included in the rollable display device of FIG. 1.
Figure 9B:
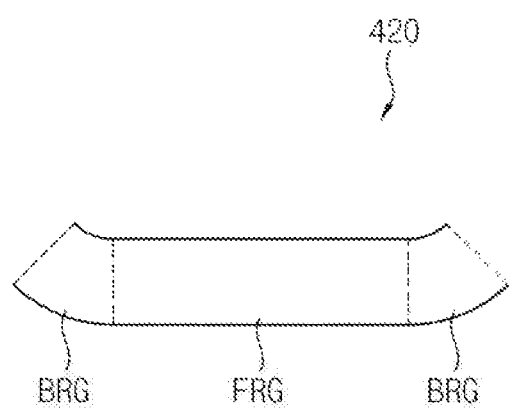
Figure 10A:
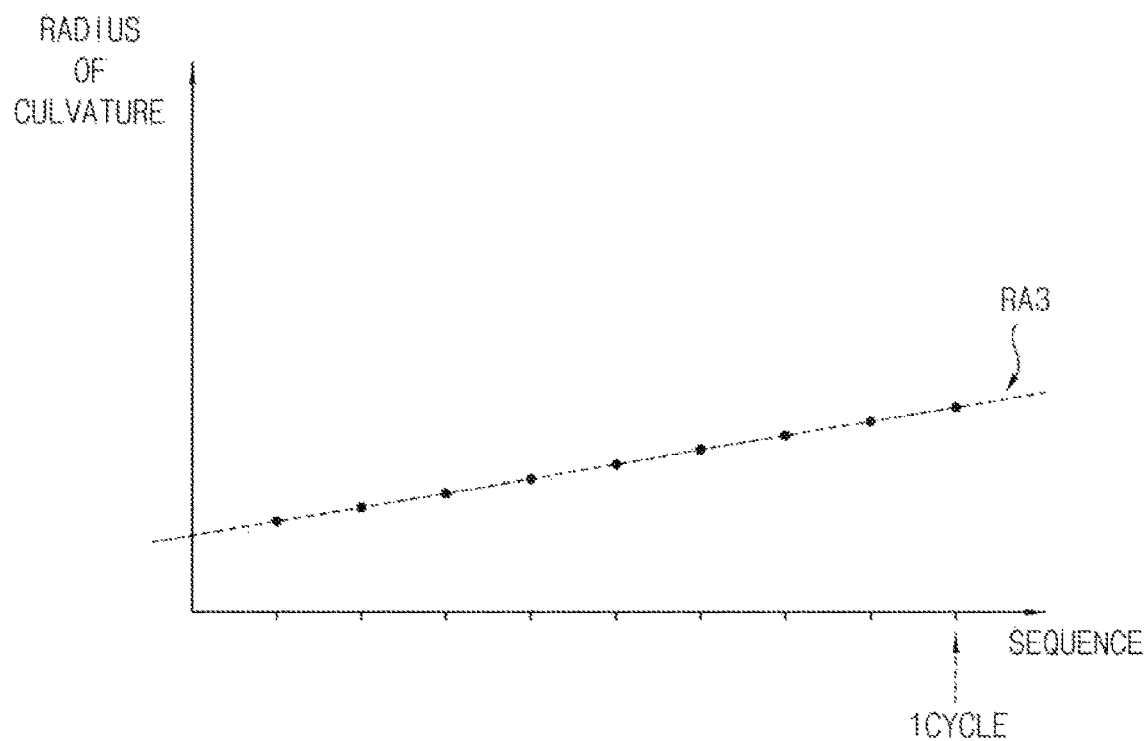
FIGS. 10A and 10B are diagrams for describing one cycle of the rollable structure of FIG. 9A.
Figure 10B:
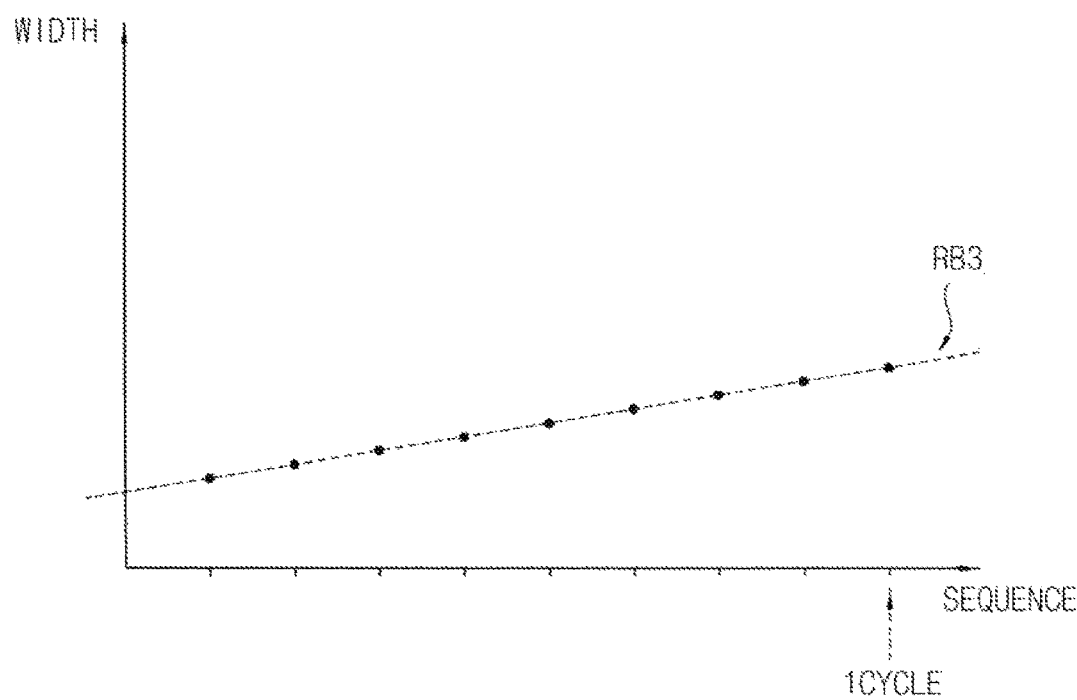

FIGS. 9A and 9B are lateral views illustrating still another example of a rollable structure included in the rollable display device of FIG. 1. FIGS. 10A and 10B are diagrams for describing one cycle of the rollable structure of FIG. 9A.

Referring to FIGS. 9A, 9B, 10A, and 10B, the rollable structure may include a plurality of unit structures 420, as shown in FIG. 9B. The rollable structure may be rolled and unrolled based on the unit structures 420. Here, each of the unit structures 420 may include a flat region FRG of that remains flat when the rollable structure is rolled, and a bendable region BRG that changes from flat to curved when the rollable structure is rolled.

As described above with respect to previously described embodiments, widths of the unit structures 420 may increase in a direction from a first side of the rollable structure to an opposite second side of the rollable structure (e.g., in the first direction FDN of FIG. 2). For example, the width of the unit structure 420 that is most adjacent the first side of the rollable structure is the smallest among the widths of the unit structures 420 included in the rollable structure, and the width of the unit structure 420 that is most adjacent the second side of the rollable structure is the greatest among the widths of the unit structures 420 included in the rollable structure.

The unit structures 420 may collectively form first through third rolling cycles when the rollable structure is rolled. Here, the second rolling cycle may encircle the first rolling cycle, and the third rolling cycle may encircle the second rolling cycle. In each of the first through third rolling cycles, the bendable regions BRG may determine a radius of curvature. Here, as the radius of curvature increases, circles respectively formed by corresponding ones of the bendable regions BRG of the unit structures 420 may increase, and thus, widths of the bendable regions BRG of the unit structures 420 may increase. Thus, because the widths of the unit structures 420 increase in the first direction FDN (see FIG. 2), an average width of the flat regions FRG of the second rolling cycle and an average radius of curvature of the bendable regions BRG of the second rolling cycle may respectively be greater than an average width of the flat regions FRG of the first rolling cycle and an average radius of curvature of the bendable regions BRG of the first rolling cycle. Similarly, an average width of the flat regions FRG of the third rolling cycle and an average radius of curvature of the bendable regions BRG of the third rolling cycle may be greater than the average width of the flat regions FRG of the second rolling cycle and the average radius of curvature of the bendable regions BRG of the second rolling cycle, respectively. In some embodiments, in each of the first through third rolling cycles, an angle between adjacent ones of the unit structures 420 may be maintained to be greater than, or equal to, a reference angle (e.g., 145 degrees). Thus, a stress otherwise applied to the display panel structure that is attached to the rollable structure, and deterioration due to the stress, may be reduced or prevented.

In other embodiments, although the widths of the flat regions FRG and the radiuses of curvature of the bendable regions BRG generally increase in the first direction FDN (see FIG. 2), the flat regions FRG and the bendable regions BRG of two or more adjacent unit structures 420 may respectively have substantially equal widths and/or radiuses of curvature (e.g., two or more flat regions FRG of unit structures 420 corresponding to a same one of the first through third rolling cycles FCY, SCY, and TCY may have equal widths, and two or more bendable regions BRG of unit structures 420 corresponding to a same one of the first through third rolling cycles FCY, SCY, and TCY may have equal radiuses of curvature). Additionally, flat regions FRG and bendable regions BRG of unit structures 420 corresponding to a particular rolling cycle may respectively have widths and radiuses of curvature that are respectively less than widths of flat regions FRG and radiuses of curvature of bendable regions BRG of unit structures 420 corresponding to a subsequent rolling cycle (e.g., flat regions FRG and bendable regions BRG of unit structures 420 corresponding to the second rolling cycle SCY may respectively have widths and radiuses of curvature that are greater than the widths of the flat regions FRG and the radiuses of curvature of the bendable regions BRG of unit structures 420 corresponding to the first rolling cycle FCY, but that are less than the widths of the flat regions FRG and the radiuses of curvature of the bendable regions BRG of unit structures 420 corresponding to the third rolling cycle TCY).

As illustrated in FIGS. 10A and 10B, in one rolling cycle (indicated by 1CYCLE), widths of the flat regions FRG of the unit structures 420 may be different from each other (indicated by RB3 in FIG. 10B), and radiuses of curvature of the bendable regions BRG of the unit structures 420 may be different from each other (indicated by RA3 in FIG. 10A). Because the widths of the unit structures 420 increase in the first direction FDN (see FIG. 2), in each of the first through third rolling cycles, the widths of the flat regions FRG of the unit structures 420 may also increase in the first direction FDN (e.g., see L1, L2, L3, and L4 in FIG. 9A). That is, the widths of the flat regions FRG of the unit structures 420 may increase according to rolling sequences of the unit structures 420 included in the rollable structure.

In addition, the radiuses of curvature of the bendable regions BRG of the unit structures 420 may increase in the first direction FDN (e.g., see R1, R2, and R3 in FIG. 9A). That is, the radiuses of curvature of the bendable regions BRG of the unit structures 420 may increase according to the rolling sequences of the unit structures 420 included in the rollable structure. As described above, because the circles formed by the bendable regions BRG of the unit structures 420 increase from the first rolling cycle to the second rolling cycle, and from the second rolling cycle to the third rolling cycle, the radiuses of curvature of the bendable regions BRG of the unit structures 420 may change (e.g., increase) at cycle transition points corresponding to the first through third rolling cycles. Thus, the widths of the bendable regions BRG of the unit structures 420 may increase at the cycle transition points of the first through third rolling cycles.

In addition, the widths of the flat regions FRG of the unit structures 420 increase from the first rolling cycle to the second rolling cycle, and from the second rolling cycle to the third rolling cycle. Thus, the widths of the flat regions FRG of the unit structures 420 may change (e.g., increase) at the cycle transition points of the first through third rolling cycles. In brief, the rollable display device 400 may include the display panel structure and the rollable structure, and may increase the widths of the unit structures 420 included in the rollable structure in the first direction FDN (see FIG. 2), where each of the unit structures 420 includes the flat region FRG that stays flat when the rollable structure is rolled, and the bendable region BRG that bends when the rollable structure is rolled. Thus, the rollable display device 400 may reduce or prevent a stress that is otherwise applied to the display panel structure when the rollable structure is rolled and unrolled by a user without use of a mounting structure, and thus, may prevent the display panel structure from being damaged or from being separated from the rollable structure.

Figure 11:
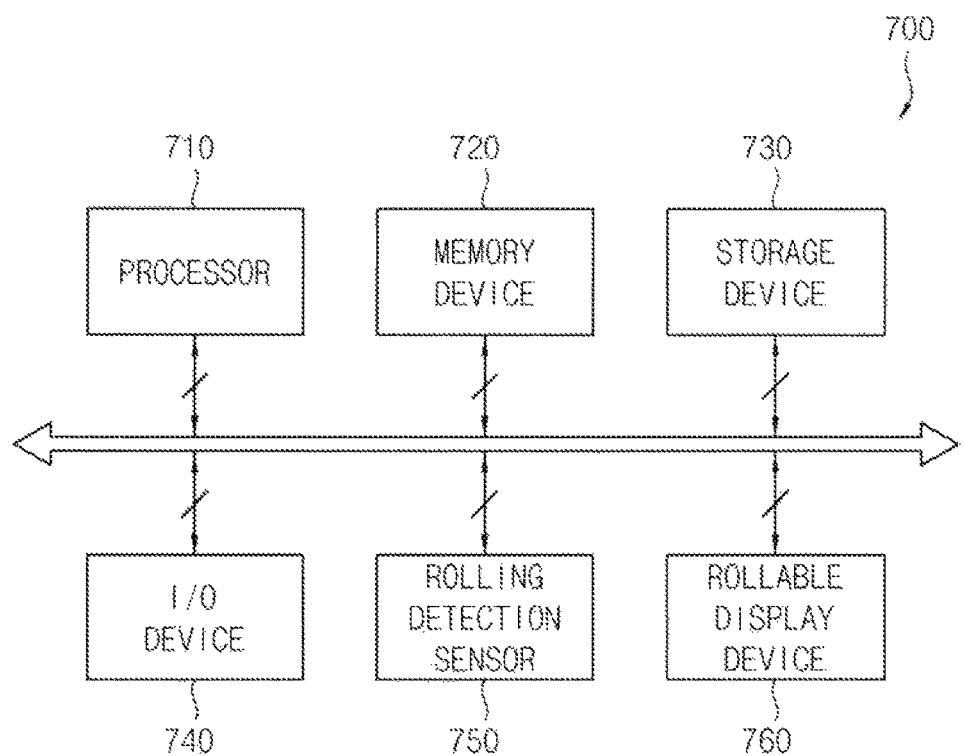
FIG. 11 is a block diagram illustrating an electronic device according to embodiments.
Figure 12:
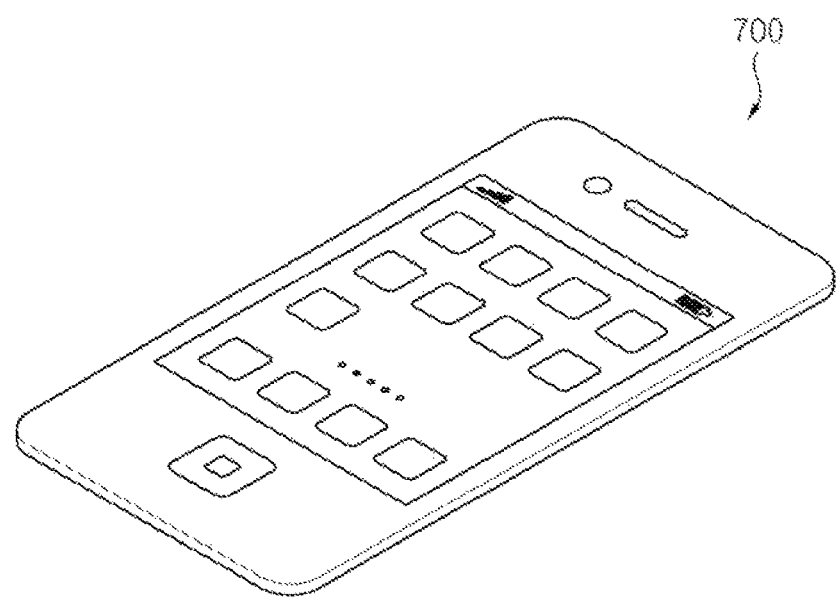
FIG. 12 is a diagram illustrating an example in which the electronic device of FIG. 11 is implemented as a flexible smart phone.

FIG. 11 is a block diagram illustrating an electronic device according to embodiments. FIG. 12 is a diagram illustrating an example in which the electronic device of FIG. 11 is implemented as a flexible smart phone.

Referring to FIGS. 11 and 12, the electronic device 700 may include a processor 710, a memory device 720, a storage device 730, an input/output (I/O) device 740, a rolling detection sensor 750, and a rollable display device 760. Here, the rollable display device 760 may be a rollable display device 100 of FIG. 1. In some embodiments, the rollable display device 760 may be implemented by an organic light emitting display device, a liquid crystal display device, etc. In addition, the electronic device 700 may further include a plurality of ports for communicating with a video card, a sound card, a memory card, a universal serial bus (USB) device, other electronic devices, etc. In an embodiment, as illustrated in FIG. 12, the electronic device 700 may be implemented as a flexible smart phone. However, the electronic device 700 is not limited thereto. For example, the electronic device 700 may be implemented as a cellular phone, a video phone, a smart pad, a smart watch, a tablet PC, a car navigation system, a television, a computer monitor, a laptop, a head mounted display (HMD), etc.

The processor 710 may perform various computing functions. Here, the processor 710 may control a displaying operation of the rollable display device 760 based on a rolling detection signal, which indicates whether the rollable display device 760 is rolled or unrolled, when the rolling detection sensor 750 outputs the rolling detection signal. The processor 710 may be a microprocessor, a central processing unit (CPU), an application processor (AP), etc. The processor 710 may be coupled to other components via an address bus, a control bus, a data bus, etc. Further, the processor 710 may be coupled to an extended bus such as a peripheral component interconnection (PCI) bus.

The memory device 720 may store data for operations of the electronic device 700. For example, the memory device 720 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc.

The storage device 730 may include a solid state drive (SSD) device, a hard disk drive (HDD) device, a CD-ROM device, etc.

The I/O device 740 may include an input device, such as a keyboard, a keypad, a mouse device, a touchpad, a touch-screen, etc., and an output device, such as a printer, a speaker, etc. In some embodiments, the electronic device 700 may further include a power supply that provides power for operations of the electronic device 700.

The rolling detection sensor 750 may generate the rolling detection signal indicating whether the rollable display device 760 is rolled or unrolled, and may provide the rolling detection signal to the processor 710.

The rollable display device 760 may be coupled to other components via the buses or other communication links. In some embodiments, the rollable display device 760 may be included in the I/O device 740.

As described above, the rollable display device 760 may include a display panel structure and a rollable structure to which the display panel structure is attached. The rollable display device 760 may prevent a stress from being applied to the display panel structure when the rollable structure is rolled and unrolled by a user without use of a mounting structure, and thus may prevent, or reduce the likelihood of, the display panel structure being damaged or separated from the rollable structure. To this end, the rollable structure may include a plurality of unit structures each including a flat region, of which a shape is maintained flat when the rollable structure is rolled, and a bendable region, of which a shape is changed from a flat shape to a curved shape when the rollable structure is rolled. Thus, the rollable structure may be rolled and unrolled based on the unit structures. Here, widths of the unit structures included in the rollable structure may be increased in a direction from a first side of the rollable structure to a second side of the rollable structure that is opposite to the first side of the rollable structure.

The unit structures may together form first through (n)th rolling cycles when the rollable structure is rolled. The (k)th rolling cycle, where k is an integer between 2 and n, may encircle the (k−1)th rolling cycle. Here, an average width of the flat regions of the (k)th rolling cycle and an average radius of curvature of the bendable regions of the (k)th rolling cycle may be greater than an average width of the flat regions of the (k−1)th rolling cycle and an average radius of curvature of the bendable regions of the (k−1)th rolling cycle, respectively.

In an embodiment, in each of the first through (n)th rolling cycles, the radiuses of curvature of the bendable regions may be equal to each other, and the widths of the flat regions may increase from the first side to the second side of the rollable structure. In another embodiment, in each of the first through (n)th rolling cycles, the widths of the flat regions may be equal to each other, and the radiuses of curvature of the bendable regions may increase from the first side to the second side of the rollable structure. In still another embodiment, in each of the first through (n)th rolling cycles, the widths of the flat regions and the radiuses of curvature of the bendable regions may increase from the first side to the second side of the rollable structure. Because embodiments of the rollable display device 760 are described above, duplicated descriptions will not be repeated.

The present inventive concept may be applied to a rollable display device and to an electronic device including the rollable display device. For example, the present inventive concept may be applied to a television, a computer monitor, a head mounted display, a laptop, a cellular phone, a smart phone, a video phone, a smart pad, a smart watch, a tablet PC, a car navigation system, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A rollable display device comprising:
a rollable structure comprising a plurality of bendable regions and a plurality of flat regions each being coupled to at least one of the bendable regions, the rollable structure being configured to be rolled and unrolled based on the flat regions and the bendable regions, the flat regions being configured to remain flat when the rollable structure is rolled, and the bendable regions being configured to change from flat to curved when the rollable structure is rolled; and
a display panel structure attached to the rollable structure,
wherein respective widths of the flat regions at least partially increase or decrease in a first direction from a first side of the rollable structure to an opposite second side of the rollable structure, the first direction being a direction in which the rollable structure is configured to be rolled, and
wherein respective widths of the bendable regions are constant in the first direction.

2. The rollable display device of claim 1, further comprising:
a driving integrated circuit configured to drive the display panel structure.

3. The rollable display device of claim 2, wherein the rollable structure further comprises a circuit region that is adjacent the first side or the second side of the rollable structure, and that has the driving integrated circuit located therein.

* * * * *